United States Patent
Gambino et al.

(10) Patent No.: US 7,405,152 B2
(45) Date of Patent: Jul. 29, 2008

(54) REDUCING WIRE EROSION DURING DAMASCENE PROCESSING

(75) Inventors: Jeffrey P. Gambino, Westford, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 10/906,013

(22) Filed: Jan. 31, 2005

(65) Prior Publication Data
US 2006/0172514 A1   Aug. 3, 2006

(51) Int. Cl.
*H01L 21/4763* (2006.01)

(52) U.S. Cl. .............. 438/625; 438/626; 438/628; 438/631; 438/637; 438/689; 438/690; 438/691; 438/697; 438/706; 438/712; 438/961; 438/FOR. 117

(58) Field of Classification Search .......... 438/625, 438/626, 627, 628, 631, 637, 689, 690, 691, 438/697, 706, 712, 961, FOR. 117
See application file for complete search history.

(56) References Cited

U.S. PATENT DOCUMENTS

| 6,375,790 B1 * | 4/2002 | Fenner ............... 156/345.28 |
| 6,709,874 B2 * | 3/2004 | Ning ............................. 438/3 |
| 7,115,511 B2 * | 10/2006 | Hautala ....................... 438/689 |
| 2002/0005676 A1 | 1/2002 | Greer |
| 2002/0068132 A1 | 6/2002 | Skinner |
| 2002/0068435 A1 * | 6/2002 | Tsai et al. ................... 438/637 |
| 2003/0021908 A1 | 1/2003 | Nickel et al. |
| 2003/0073314 A1 | 4/2003 | Skinner et al. |
| 2004/0060899 A1 | 4/2004 | Waldhauer et al. |
| 2004/0060900 A1 | 4/2004 | Waldhauer et al. |
| 2004/0061176 A1 | 4/2004 | Takafuji et al. |
| 2006/0043590 A1 * | 3/2006 | Chen et al. ................... 257/752 |
| 2006/0105570 A1 * | 5/2006 | Hautala et al. ............. 438/687 |

FOREIGN PATENT DOCUMENTS

JP     2003-249426     9/2003

\* cited by examiner

*Primary Examiner*—Thanh V Pham
(74) *Attorney, Agent, or Firm*—Anthony J. Canale; Greenblum & Bernstein P.L.C.

(57) ABSTRACT

A damascene process incorporating a GCIB step is provided. The GCIB step can replace one or more CMP steps in the traditional damascene process. The GCIB step allows for selectable removal of unwanted material and thus, reduces unwanted erosion of certain nearby structures during damascene process. A GCIB step may also be incorporated in the damascene process as a final polish step to clean up surfaces that have been planarized using a CMP step.

9 Claims, 7 Drawing Sheets

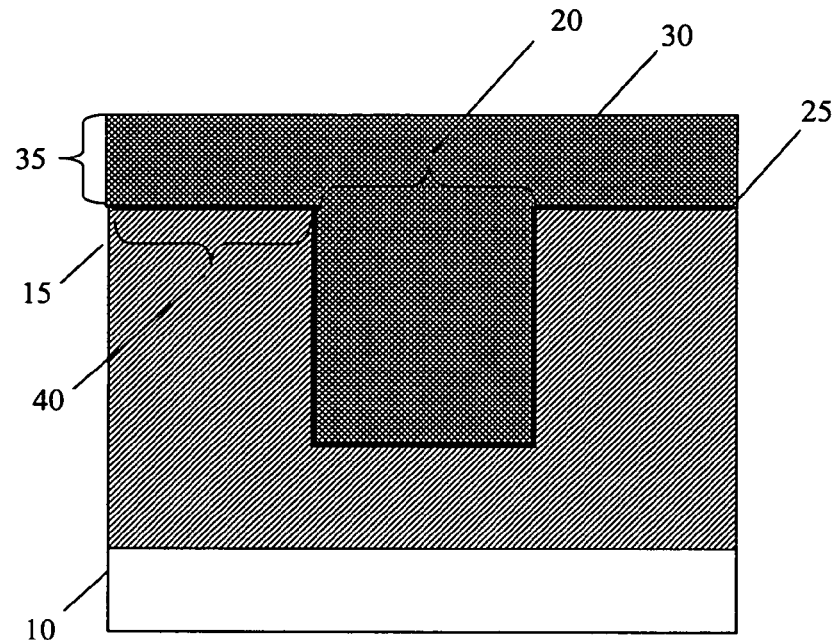
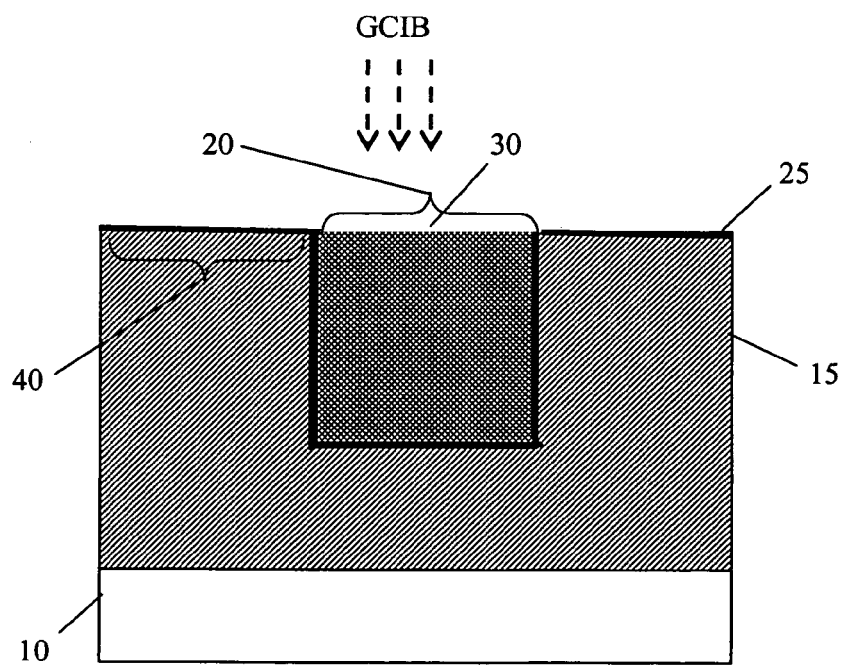

|  | CMP | CF₄/Ar 4E15 | CF₄/Ar 6E15 | CF₄/Ar 8E15 | CF₄/O₂ 4E15 | CF₄/O₂ 6E15 | CF₄/O₂ 8E15 | SF₆/O₂ 2E15 | SF₆/O₂ 4E15 | SF₆/O₂ 6E15 |
|---|---|---|---|---|---|---|---|---|---|---|
| Wire Shorts Yield | 100% | 95% | 93% | 95% | 95% | 93% | 93% | 88% | 95% | 95% |
| Wire Resistance (mΩ/μm) | 70 | 55 | 54 | 56 | 53 | 54 | 55 | 53 | 52 | 56 |
| Wire Resistance Range (mΩ/μm) | 10 | 5 | 5 | 5 | 5 | 5 | 5 | 5 | 5 | 5 |
| Estimated Wire Height (nm) | 320 | 407 | 415 | 400 | 422 | 415 | 407 | 422 | 431 | 400 |

FIG. 12

REDUCING WIRE EROSION DURING DAMASCENE PROCESSING

FIELD OF THE INVENTION

The invention relates to damascene processing in a semiconductor device, and more particularly, to reducing wire erosion during damascene processing.

BACKGROUND DESCRIPTION

Interconnects of a semiconductor device are formed by various methods, including a damascene process. It should also be noted that the damascene process can be incorporated into the fabrication of many types of semiconductor devices such as MOSFET or bipolar junction transistors (BJT), etc., and various structures such as resistors, wires, and vias, etc. The damascene process typically includes first forming a trench in a substrate. The trench in the substrate is formed having a width which substantially corresponds to the desired final width of the interconnect. Additionally, the trench traditionally will have a depth which is slightly deeper than the desired final height or thickness of the interconnect. It should be noted that the damascene process can be used to form a variety of structures in addition to a trench, such as vias, however, all such structure will be referred to simply as trenches for simplicity.

Once the trench has been formed, the trench and adjacent surface areas of the substrate are coated with conducting material. In some damascene processes, the trench may receive a liner material which includes a thin layer of a material which is conformably deposited to the bottom and sides of the trench and the surrounding substrate surface. Additionally, some damascene processes include a metal seeding process, where a seed of trench-fill material is deposited within the trench and on the substrate surfaces to aid in bulk material deposition. For example, where the trench-fill material will be copper, a copper seed is deposited in the trench. It should be noted that the trench may be filled with a conductor or a dielectric; however, since the trench-fill in a damascene process is typically a conductor, the terms "trench-fill" and "bulk conductor" will be used synonymously herein, even though the trench-fill may also be a dielectric.

One of the potential problems of forming an interconnect or via with the damascene process is the form action at unwanted voids or inclusions in the bulk conductor as it is deposited within the trench. Accordingly, the seed deposition may help to reduce void or inclusion formation by aiding in the uniform deposition of trench-fill material. Additionally, a trench having a high aspect ratio, i.e., one that is much taller than wider will have a greater tendency to have voids or inclusions formed in the material deposited therein. Where the trench forms a wire or interconnect, voids or inclusions in the conductor of the wire or interconnect will increase the resistance of the wire or interconnect and negatively impact device performance.

After the trench-fill material has been deposited, the upper portions of the bulk conductor are removed, typically by a chemical, mechanical polishing (CMP) process. The upper portions of the bulk conductor are typically removed so that the only bulk conductor remaining lies within the trench. Thus, all or substantially all of the bulk conductor is removed from the surfaces surround the trench.

Where a liner is deposited on the substrate, the bulk conductor typically is removed from the substrate surface but substantially not from inside the trench to expose substantially all of the liner in a first polishing step. After the bulk conductor has been removed from surfaces of the substrate, any exposed portions of a liner are removed in a second polishing step. The exposed portions of the liner are usually removed by a CMP process. In certain damascene processes, the liner is a conductor, and thus it important for all of the liner material to be removed from the surfaces of the substrate surrounding the trench to prevent shorts between wires and interconnects.

Also, the surfaces of substrate underlying the liner may have topographic imperfections, such as bumps, scratches or depressions, which the liner has filled in. Accordingly, portions of the substrate which protrude above the lowest portion of the lower surface of the liner will be removed first during liner removal. Thus, for all of the liner material to be removed from any low spots on the substrate surface, a significant portion of the substrate itself may have to be removed. Additionally, the CMP process may not be uniform across the surface of the substrate, and thus, some regions of the substrate will be exposed before all of the liner has been removed, thus also necessitating removal of significant portions of the substrate in certain regions of wafer.

Because the bulk conductor has had the upper portions removed down to the top edge of the trench, any removal of the substrate will necessarily also remove portions of the bulk conductor residing in the trench. Accordingly, such unwanted removal of the bulk conductor will increase the resistivity of the interconnect. Because interconnects having higher resistivities are undesirable, the typical damascene process starts with forming a trench which is deeper than the final desired interconnect thickness. Such extra interconnect thickness remaining after the removal of the upper portions of bulk conductor allows for interconnect erosion during the final stages of liner removal. However, as noted above, because trenches with higher aspect ratios have a greater chance of void or inclusions being formed within the interconnect, increasing the depth of a trench to accommodate interconnect erosion is undesirable. Accordingly, a method for removing materials during a damascene process which avoids interconnect erosion is desirable.

As such, damascene processes typically utilize a two step metallization process in which the trenches and/or vias are filled with a thin liner follower by a thicker layer of bulk conductor. For example, for copper wiring, the liners are typically tantalum (Ta) or tantalum based material. After damascene trench formation, the process continues with a Ta liner deposition and copper deposition. The copper deposition step typically includes a plasma vapor deposition (PVD) copper seed followed by an electroplated copper layer. An anneal process may be optionally included after the bulk copper deposition.

After the bulk copper has been deposited, an upper portion of the bulk copper is removed with a copper CMP process to the exposed portions of the liner. Next, a tantalum CMP process is used to remove all of the liner on the wafer surface adjacent to the interconnects. Accordingly, where the liner has filled in scratches, recesses and other topological imperfections on the wafer, the liner material must be removed at the expense of removing the surrounding wafer material. As such, a considerable amount of intermetal dielectric (IMD), which is coplanar with the damascene interconnect or via surface, is removed while removing all the liner material from the lowest portions of the topological imperfections.

Typical IMD removals range from 50-100 nm for thin (about 100-300 nm height) single damascene wire level to 100-250 nm for a super thick (about 3 um height) wire. Accordingly, the IMD erosion during the CMP process requires the wires or vias to be fabricated with pre-metallization heights greater than the final metallization heights, which increases the chance of unwanted voids or inclusions being formed in the wire or via.

Wire height and aspect ratio for interconnects formed during a damascene process using a post reactive ion etch (RIB) and a post CMP material removal process are shown in Table A. Each row in Table A corresponds to a particular type of device upon which the damascene interconnect formation process was used. As can be seen from Table A, a damascene process for a 90 nm generation M1 has a wire height of 280 nm with an aspect ratio of 2.50 after the RIB etch, and a wire height of 180 nm with an aspect ratio of 1.61 after the CMP step. Accordingly, about 100 nm of material has been eroded from the interconnect structure during the CMP step. For a relatively large wire such as 130 nm generation 6× wire, the post RIE wire height is 3.3 um with an aspect ratio of 2.8, and the post CMP wire height is 3.0 um with an aspect ratio of 2.5.

TABLE A

|  | Post RIE Wire Heights | Aspect Ratio | Post CMP Wire Heights | Aspect Ratio |
| --- | --- | --- | --- | --- |
| 90 nm generation M1 | 280 nm | 2.50 | 180 nm | 1.61 |
| 90 nm generation M3 | 380 nm | 2.71 | 250 nm | 1.79 |
| 90 nm generation 2X Wire | 550 nm | 1.96 | 400 nm | 1.43 |
| 130 nm generation 6X Wire | 3.3 um | 2.8 | 3.0 um | 2.5 |

Accordingly, as the trend shown in Table A indicates, the amount of material eroded during the CMP step remains relatively constant regardless of the size of the wire being formed by the damascene process. Consequently, as wire size shrinks, a larger proportion of wire will be eroded during the CMP step, thus requiring ever increasing aspect ratios and a corresponding increase in the chance of a void or inclusion formation during the damascene process. As such, wire erosion during the damascene process will have an increasingly negative impact on fabrication yield for smaller and smaller interconnects and devices. Although the damascene process typically uses a conductor as trench-fill material, a non-conductor may also be used as trench-fill material.

SUMMARY OF THE INVENTION

In a first aspect of the invention, a method comprises reducing erosion in a damascene process including arranging a first layer in a trench in a substrate and on a surface of the substrate adjacent to the trench, and removing a portion of the first layer by impacting large clusters of preselected types of atoms on the portion of the first layer to be removed.

In another aspect of the invention, a method of a damascene process includes forming a trench in a substrate, and arranging a first material in the trench and on a surface of the substrate. The method also includes removing a portion of the first material with a gas cluster ion beam.

In another aspect of the invention, a method of forming an interconnect on a film comprising a trough includes arranging a barrier material on a substrate comprising a trench, and arranging a conductor on the substrate leaving exposed portions of the barrier material. The method also includes removing at least one of the exposed portions of the barrier material or a portion of the conductor by directing a gas cluster ion beam onto a material to be removed.

BRIEF DESCRIPTION OF THE DRAWINGS

FIGS. 1-3 show steps of a damascenes process;
FIGS. 4 and 5 show steps of an embodiment of a damascene process in accordance with the invention;
FIG. 12 shows results of a comparison of a damascene process incorporating at least one GCIB step to a traditional damascene process for various GCIB chemistries.

DETAILED DESCRIPTION OF EMBODIMENTS OF THE INVENTION

The invention allows forming metal interconnects of lower aspect ratio in a damascene process and thus reduces the chance of inclusions or voids being formed during the damascene process. Embodiments of the invention achieve these advantages by incorporating a gas cluster ion beam (GCIB) process in addition to, or in place of one or more CMP processes in a damascene formation process. In other words, embodiments of the invention replace a CMP step in a damascene process with a GCIB step or add a GCIB step to the CMP steps. Because the GCIB step may be optimized to be selective to certain materials to be removed, there is little unwanted erosion of other materials during the GCIB step, and the height of the metal interconnect is preserved during processing.

Figure 1:
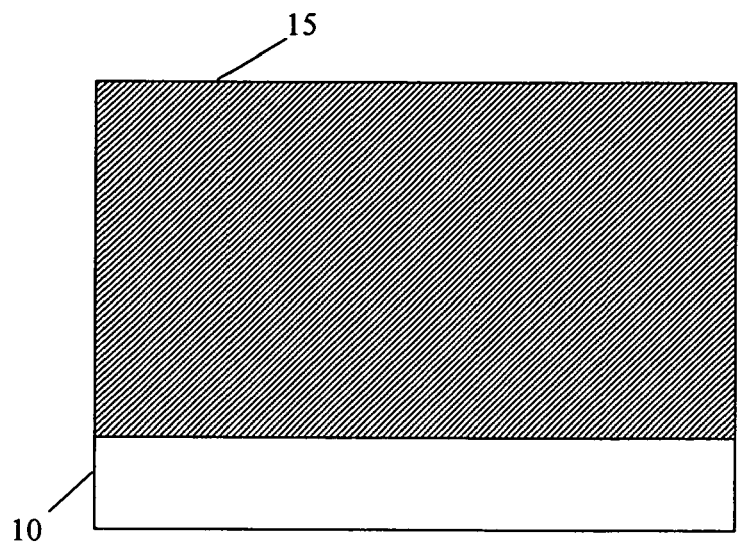

Referring to FIG. 1, a substrate 10 has a dielectric 15 formed thereon. The dielectric 15 can be formed by any of the methods well known in the art for forming a dielectric layer on a substrate, such as, for example, plasma enhanced chemical vapor deposition (PECVD), high density plasma CVD (HDPCVD), sub-atmospheric CVD (SCVD), atmospheric pressure CVD (APCVD), atomic layer deposition (ALD), pulsed deposition layer (PLD), and spin-on and sputtered deposition.

Figure 2:
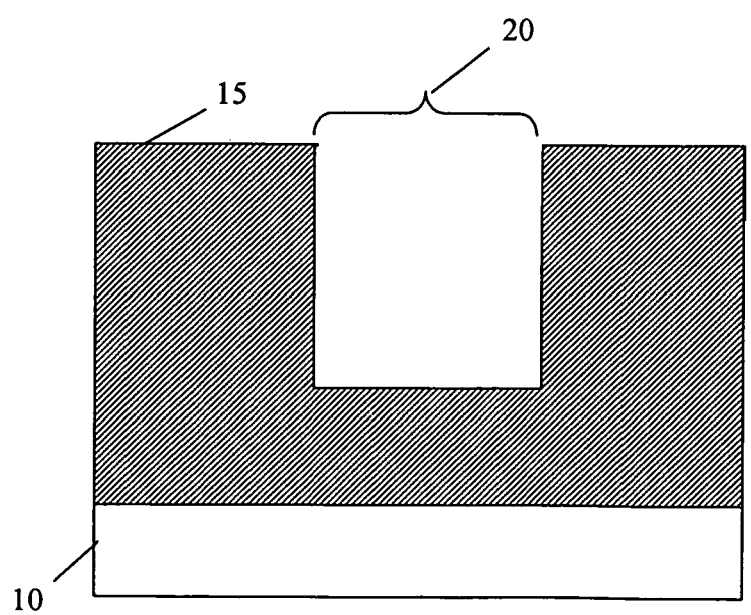

Referring to FIG. 2, a trench 20 is formed in the dielectric 15. The trench 20 can be formed in the dielectric 15 by any of the methods well known in the art suitable for forming a trench in a dielectric such as, for example, any well known etching process. Although FIG. 2 shows a trench 20 formed in the dielectric 15, various other shaped depressions or recesses may be formed in the dielectric 15 and still be compatible with the principals of the invention such as, two or more wire trenches, via holes, via trenches, or dual damascene wire and via holes or trenches.

Referring to FIG. 3, after the trench 20 has been formed, the surfaces of the trench 20 and the surrounding surfaces of the dielectric 15 are covered with a liner 25. The liner 25 is typically about 20 nm thick, but can range from 1-200 nm, and is typically formed of a metal such as, for example, tantalum, tantalum nitride, etc. The liner 25 may be formed on the surfaces of the trench 20 and dielectric 15 by any of the methods well known in the art for conformally depositing a liner material in a trench. It should be noted that the material of the liner 25 should be selected to be compatible with materials deposited on the liner 25 such as Ta, TaN, TaSiN, W, WN, WSiN, etc. After the liner 25 is deposited, a bulk conductor 30 is deposited within the trench on the liner 25, and other areas of the device by any of the methods well known in the art for bulk conductor deposition.

Where the trench 20 forms a wire, the bulk conductor 30 is typically chosen to have a low resistivity and may include, for example, copper, aluminum, tungsten, polysilicon, etc.

Accordingly, the resulting structure includes a substrate 10 with a dielectric 15 deposited thereon. The dielectric 15 has a trench 20 with a liner 25 formed on the surface of the dielectric and within the trench. An upper portion 35 of the bulk conductor 30 extends above the top of the trench 20.

Figure 5:
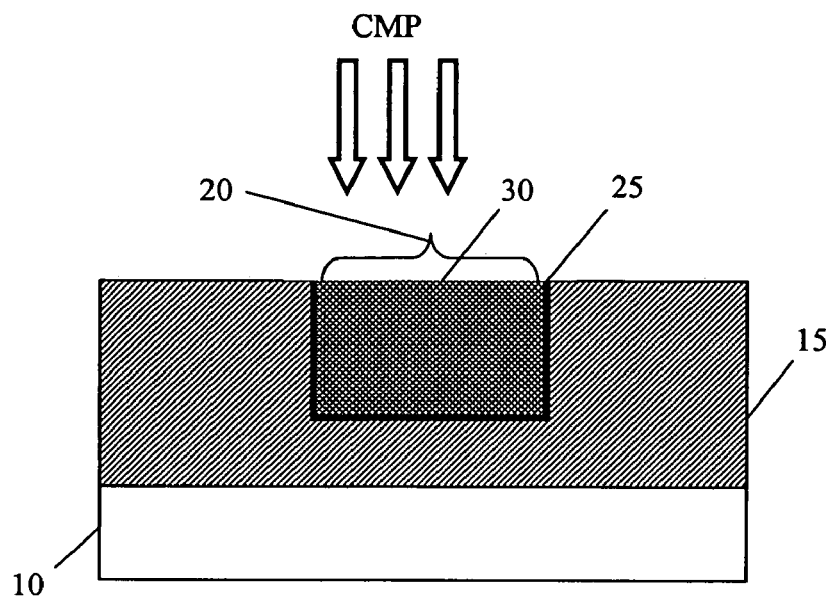

Referring to FIGS. 4 and 5, the upper portion 35 of the conductor 30 is removed using a GCIB process.. The GCIB process includes directing large clusters of atoms or molecules onto the surface of the material to be removed. The GCIB process may include a beam having either atoms and molecules, or a combination of both, in clusters.

For simplicity, all types of beams will be referred to as clusters of atoms. A cluster of atoms can have energies of 1-30 keV and a beam of clusters can have current densities up to 1000 MicroAmps in one embodiment. Additionally, the types of atoms and molecules within a cluster may be selected to control the chemical reaction between the cluster and the material being removed. For example, the clusters may include molecules such as, for example, $CF_4$, $NF_3$, $BF_3$, $CF_6$, $O_2$, $N_2$ and $C_4$. Also, the cluster of atoms or molecules may include reactive gasses such as oxygen, etc., and may also include inert gasses such as argon, etc.

As an example, a cluster of atoms may include about 5000 atoms per cluster and provide an average flux equivalent to 7 $mA/cm^2$. By appropriately selecting the constituents of the clusters, the GCIB process can cause a chemical reaction between the material to be removed and the clusters of atoms which are highly selective to the material to be removed thus avoiding erosion of any surrounding dissimilar materials. Accordingly, a reactive gas such as $CF_4$ may be mixed with an inert gas such as argon, or a reactive gas such as $O_2$ to accomplish such advantages. Additionally, example beam constituents range from $1 \times 10^{15}/cm^2$ to $10 \times 10^{15}/cm^2$ of a mixture of $CF_4$ and argon. Other example constituents range from $1 \times 10^{15}/cm^2$ to $10 \times 10^{15}/cm^2$ of $CF_4$ and $O_2$. Also, another example of beam chemistry includes a range of $1 \times 10^{15}/cm^2$ to $10 \times 10^{15}/cm^2$ of $SF_6$ and $O_2$.

In the GCIB process, the kinetic energy of the atomic or molecular cluster is shared among the several thousand loosely bound atoms or molecules which make up the cluster, which alters the physical process when the cluster interacts with the surface compare to other types etching processes. Accordingly, the GCIB process provides an extremely wide range of ion beams allowing for a wide range of highly material-selective removal processes.

Referring again to FIG. 4, the upper portion 35 of the Conductor 30 being removed to expose the surface portions 40 of the liner 25 using a GCIB process. As such, the exposed upper surface of the conductor 30 is coplanar with the liner 25.

In FIG. 5, a CMP process is used to remove the surface portions 40 of the liner 25, and a portion of the bulk conductor 30. Additionally a portion of the dielectric 15 is also removed in this step. After the CMP process, the upper surface of the bulk conductor 30 is coplanar with the upper surface of the dielectric 15, and an interconnect has been formed within the substrate 15 using a damascene process incorporating a GCIB step.

Figure 6:
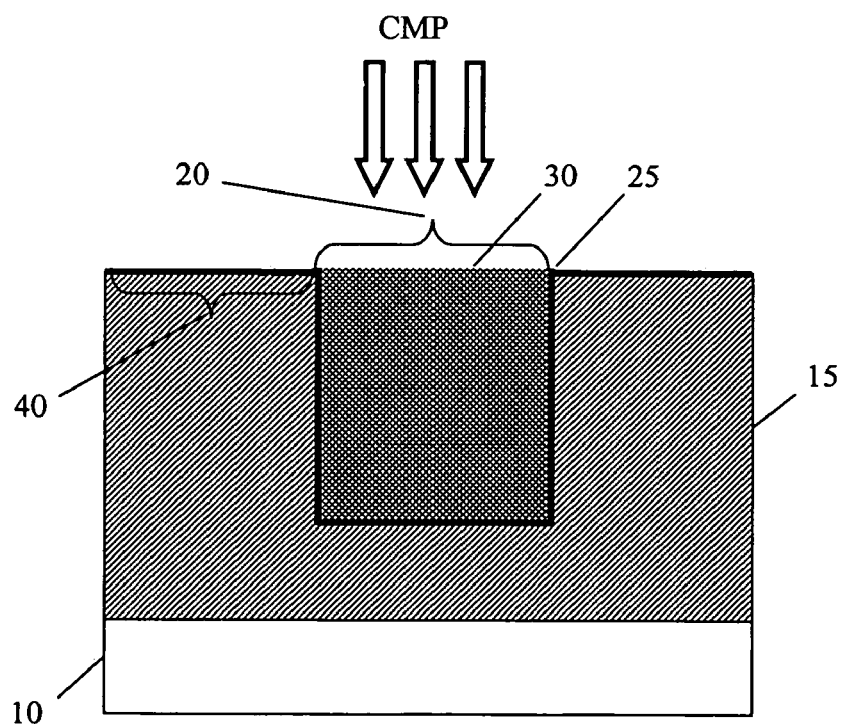
FIGS. 6-8 show steps in an embodiment of a damascenes process in accordance with the invention.
Figure 7:
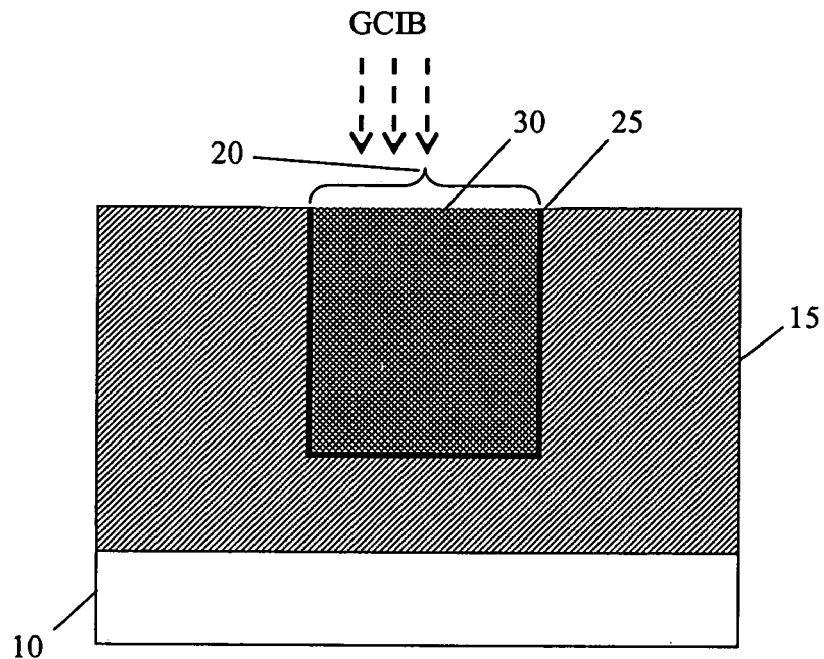

Referring to FIGS. 6 and 7, a second embodiment of the invention is shown. The starting structure is shown in FIG. 3 and includes a trench 20 lined with a liner 25 with the liner 25 covering the surfaces of the dielectric 15 surrounding the trench 20. The trench 20 is then filled with a bulk conductor 30 having a upper portion 35 extending above the upper most portion of the trench 20.

Referring to FIG. 6, an upper portion 35 of the bulk conductor 30 has been removed using a CMP process well known in the art to leave exposed surface portions 40 of the liner 25. Consequently, the upper surface of the bulk conductor 30 is coplanar with the surface portions 40 of the liner 25.

Referring to FIG. 7, a GCIB process is used to remove the surface portions 40 of the liner 25 and portions of the bulk 30. The GCIB process is similar to the GCBI process described in FIG. 4 with the chemistry and parameters appropriately adjusted to selectively remove the material of the liner 25 and to remove portions of the bulk conductor 30 to form a planar surface. Accordingly, relatively small amounts of the bulk conductor 30 are removed in conjunction with removing the exposed surface portions 40 of the liner 25, thereby minimizing the amount of erosion to the bulk conductor 30 lying within the trench 20.

Figure 8:
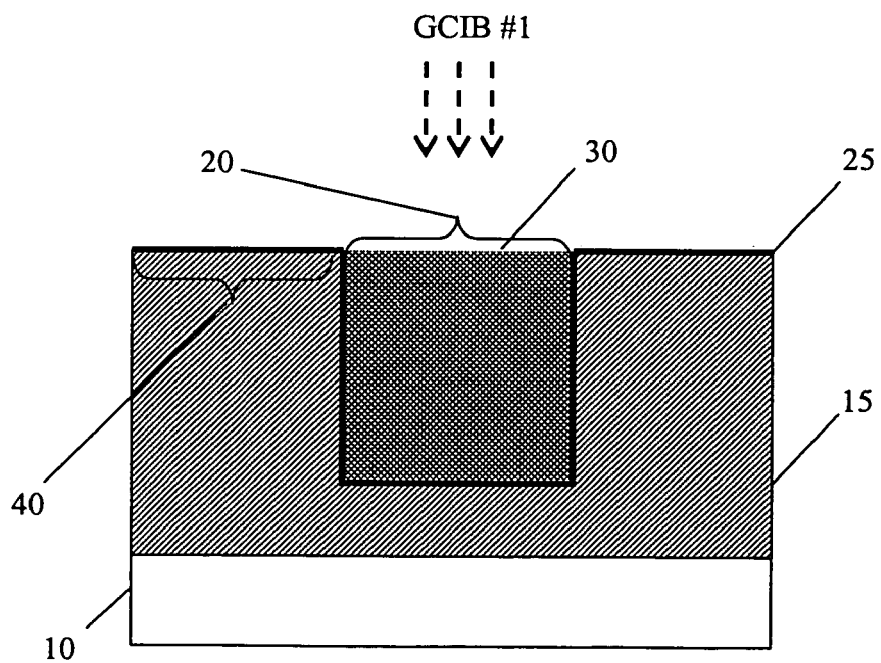
Figure 9:
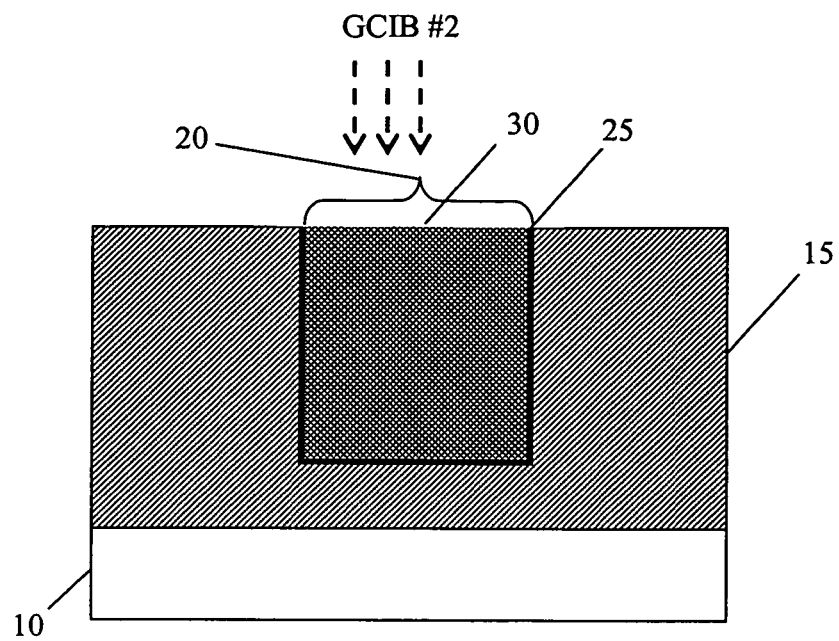
FIGS. 9-11 show an embodiment of a damascene process in accordance with the invention.

Referring to FIGS. 8 and 9, a third embodiment of the damascene process incorporating a GCIB step is shown. The beginning structure is similar to that shown in FIG. 3. Referring to FIG. 8, the upper portion 35 of the bulk conductor 30 is removed using a GCIB process. The GCIB process used to remove the upper portion 35 of the bulk conductor 30 are similar to those discussed above and additionally has the chemistry of the beam adjusted to remove the material of the bulk conductor 30. Thus, the exposed surface portions 40 of the liner 25 are exposed and are coplanar with a top surface of the bulk conductor 30.

Referring to FIG. 9, a second GCIB process is used to remove exposed surface portions 40 of the liner 25, as well as to remove the portion of the bulk conductor 30, which was coplanar to the exposed surface portions 40 of the liner 25. Accordingly, the exposed surface portions 40 of the liner 25 are removed from the dielectric 15 with minimal erosion to the bulk conductor 30 in the trench 20.

Figure 10:
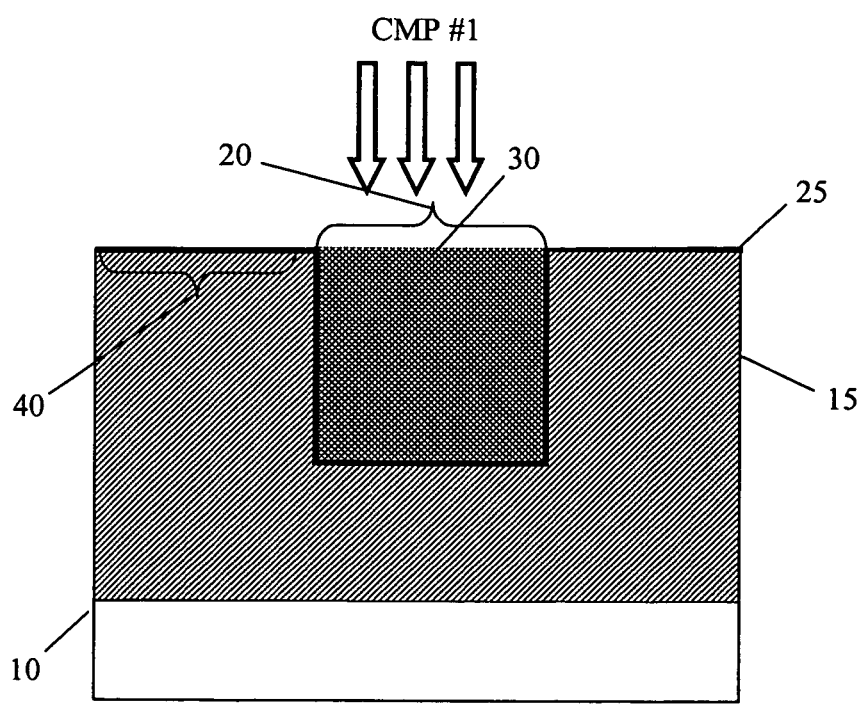
Figure 11:
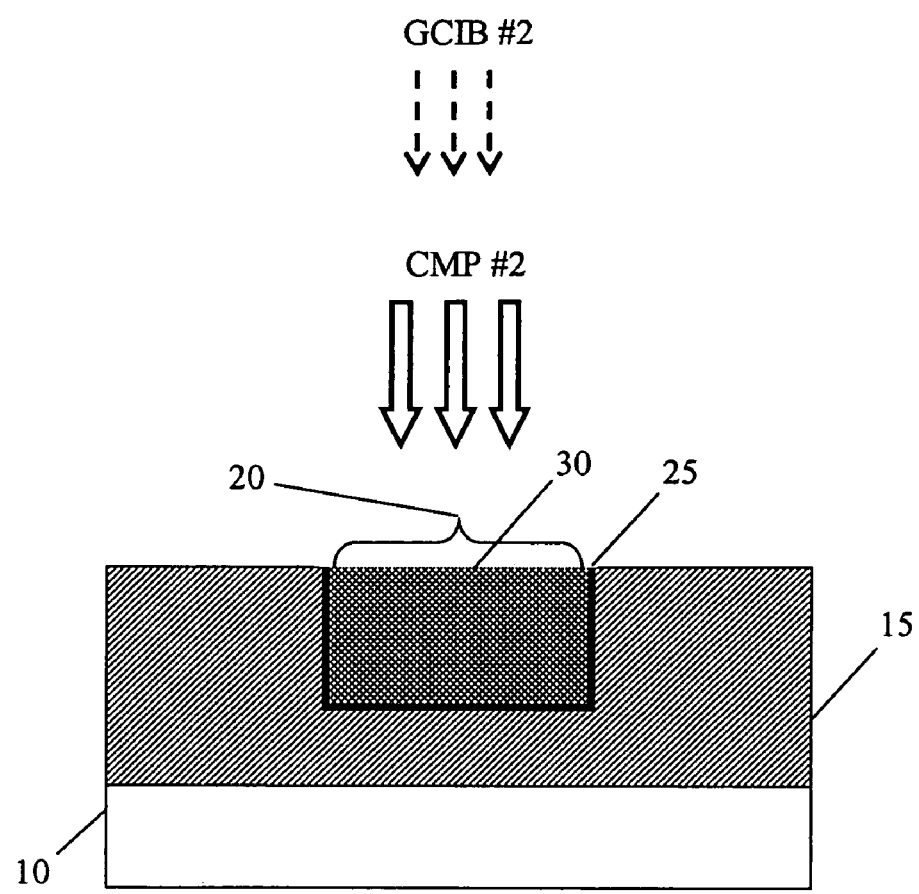

FIGS. 10 and 11 show a fourth embodiment of the invention. The beginning structure is similar to the structure shown in FIG. 3.

Referring to FIG. 10, the upper portion 35 of the bulk conductor 30 is removed using a CMP process. Thus, the surface portions 40 of the liner 25 are exposed in this step. Additionally, the upper surface of the bulk conductor 30 in the trench 20 is coplanar with the exposed surface portion 40 of the liner 25.

Referring to FIG. 11, a second CMP process removes the exposed surface portions 40 of the liner 25, and material from the bulk conductor 30 within the trench 20. After the second CMP process is completed, a GCIB process is used as a final polish to remove any remaining unwanted portion of the liner 25 or bulk conductor 30.

As described above, at least one GCIB step is incorporated into a damascene process for forming interconnects and dielectric filled trenches and vias. By incorporating the GCIB process into the damascene process, trenches and vias having low aspect ratios may be used because there is less erosion of the material in the trench or via during the planarization and polishing steps. Accordingly, the occurrence of voids and inclusions in the trench-fill material is reduced and fabrication yield is increased. Additionally, the damascene process can be incorporated into the fabrication of smaller structures and devices.

Referring to FIG. 12, the results of a damascene process incorporating at least one GCIB step is compared to a traditional damascene process for various GCIB chemistries. The testing was performed with a 200 mm diameter wafer which was 725 μm thick and a copper wire damascene process where the trenches for the wire are etched about 400 nm plus or minus 50 nm into the dielectric. The first column is labeled CMP and shows the results of a traditional damascene process. Columns 2-10 show the results of a damascene process incorporating at least one GCIB step having various chemistries. The chemistry and density of the GCIB process is listed at the top of each column. The second row shows the yield of wires not having shorts. The third row shows the resistance of the wires formed by the various processes. The fourth row shows the variation in resistance in wires formed by the various processes. The fifth row shows an estimated wire height of the wires formed by the various processes.

As shown in the first entry for wire shorts of the CMP damascene process, the yield is 100%. The yield for the various damascene processes incorporating a GCIB step is substantially above 90% for all but one process which uses $SF_6/O_2$ at a dose of $2\times10^{15}/cm^2$. As seen, the CMP based damascene process results in a wire having a higher resistance, as well as having a factor of 2 wider variation in resistance as compared to the damascene process incorporating a GCIB step. Finally, the estimated wire height is shown to be much lower for the damascene process incorporating the CMP step as compared to the damascene processes incorporating a GCIB step. Thus, the data shows a damascene process incorporating a GCIB step will produce thicker wires having a lower resistance and a lower variation in resistance from one wire to the next.

While the invention has been described in terms of exemplary embodiments, those skilled in the art will recognize that the invention can be practiced with modifications and in the spirit and scope of the appended claims.

What is claimed is:

1. A method of reducing erosion in a damascene process, comprising the steps of:
    arranging a barrier material in a trench in a substrate and on a surface of the substrate adjacent to the trench;
    arranging a conductor on the barrier material in the trench and over the surface of the substrate adjacent to the trench;
    selectively removing a first portion of the conductor using a first gas cluster ion beam (GCIB) process that is selective to the conductor; and
    removing a second portion of the conductor and a portion of the barrier material using a second GCIB process.

2. The method of claim 1, wherein the barrier material comprises tantalum or tantalum nitride and the conductor comprises at least any one of a polysilicon, tungsten, copper, and aluminum.

3. A method of a damascene process, comprising the steps of:
    forming a trench in dielectric material disposed on a substrate;
    arranging a barrier material in the trench and on a surface of the dielectric material;
    arranging a conductor on the barrier material:
    selectively removing a first portion of the conductor using a first GCIB process that is selective to the conductor such that an exposed surface portion of the barrier material is coplanar with a top surface of the conductor; and
    removing a second portion of the conductor and a portion of the barrier material using a second GCJB process.

4. The method of claim 3, wherein the barrier material comprises a liner and the conductor comprises at least any one of a polysilicon, tungsten, copper, or aluminum.

5. A method of forming an interconnect, comprising:
    forming a dielectric on a substrate;
    forming a trench in the dielectric;
    arranging a barrier material on the dielectric in the trench and on an upper surface of the dielectric adjacent the trench;
    arranging a conductor on the barrier material in the trench and over the upper surface of the dielectric adjacent the trench;
    selectively removing a first portion of the conductor using a first GCIB process that is selective to the conductor; and
    removing a second portion of the conductor and a portion of the barrier material using a second GCIB process.

6. The method of claim 5, further comprising selecting constituents of the first GCIB process to be selective to the conductor thereby avoiding erosion of the barrier material during the first GCIB process.

7. The method of claim 6, wherein the first GCIB process exposes a surface portion of the barrier material.

8. The method of claim 7, wherein, after the first GCIB process, the exposed surface portion of the barrier material is coplanar with a top surface of the conductor.

9. The method of claim 8, wherein the portion of the barrier material removed by the second GCIB process is disposed on the upper surface of the dielectric adjacent the trench.

* * * * *